(12) United States Patent
Oehm et al.

(10) Patent No.: US 6,995,626 B2
(45) Date of Patent: Feb. 7, 2006

(54) TUNABLE CAPACITIVE COMPONENT, AND LC OSCILLATOR WITH THE COMPONENT

(75) Inventors: Jürgen Oehm, Ratingen (DE); Duyen Pham-Stäbner, Ratingen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/934,167

(22) Filed: Sep. 3, 2004

(65) Prior Publication Data

US 2005/0088249 A1  Apr. 28, 2005

Related U.S. Application Data

(63) Continuation of application No. PCT/DE03/00390, filed on Feb. 11, 2003.

(51) Int. Cl.
H03B 5/04 (2006.01)
H03B 5/12 (2006.01)

(52) U.S. Cl. .................... 331/177 V; 331/117 FE; 331/176

(58) Field of Classification Search ............. 331/36 C, 331/66, 69, 70, 117 R, 117 FE, 117 D, 175, 331/176, 177 V; 361/271, 277; 333/174–176; 334/15
See application file for complete search history.

(56) References Cited

U.S. PATENT DOCUMENTS

| | | | |
|---|---|---|---|
| 5,714,907 A | 2/1998 | Bazes | |
| 5,926,064 A | 7/1999 | Hariton | |
| 6,292,065 B1 | 9/2001 | Friedman et al. | |
| 2001/0020875 A1 | 9/2001 | Jansson | |
| 2001/0035797 A1 | 11/2001 | Gutierrez | |
| 2002/0008593 A1 | 1/2002 | Gomez et al. | |
| 2002/0014925 A1 | 2/2002 | Ochiai | |
| 2005/0030116 A1 * | 2/2005 | Takagi | 331/177 V |

FOREIGN PATENT DOCUMENTS

| | | |
|---|---|---|
| DE | 100 21 867 A1 | 11/2001 |
| EP | 0 676 684 A2 | 10/1995 |
| EP | 0 902 483 A1 | 3/1999 |

OTHER PUBLICATIONS

"A -94dBc/Hz@ 100kHz, fully-integrated, 5-GHz, CMOS VCO with 18% tuning range for Bluetooth applications", C. Samori, S. Levantino and V. Boccuzzi, IEEE 2001 Custom Integrated Circuits Conference, ISBN 0-7803-6591-7, pp. 201-304.

"A 2.2 GHz CMOS VCO with Inductive Degeneration Noise Suppression", Pietro Andreani and Henrik Sjöland, IEEE 2001 Custom Integrated Circuits Conference, ISBN 0-7803-6591-7, pp. 197-200.

* cited by examiner

Primary Examiner—David Mis
(74) Attorney, Agent, or Firm—Eschweiler & Associates, LLC

(57) ABSTRACT

The invention is directed to a tunable, capacitive component that includes a pair of MOS transistors whose gate connections are connected via a respective coupling capacitance to a pair of circuit nodes between which the tuned capacitance can be tapped off. The four load connections of the MOS transistors are connected to one another. In addition, a tuning input and a reference signal input are provided that are both coupled to the transistor pair. In this arrangement, the reference signal input is designed for setting the operating point of the transistors. The tunable capacitance has a large tuning range and also a low series resistance and permits good linearity properties on account of the operating point setting. The component can be used advantageously in LC oscillators.

8 Claims, 11 Drawing Sheets

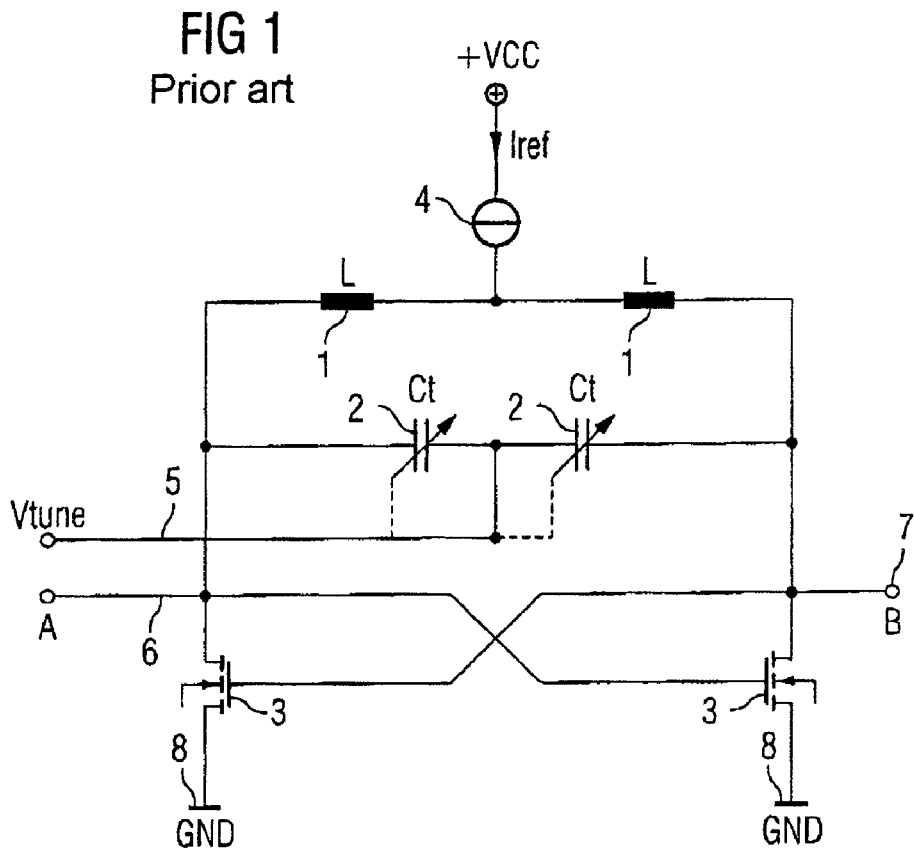
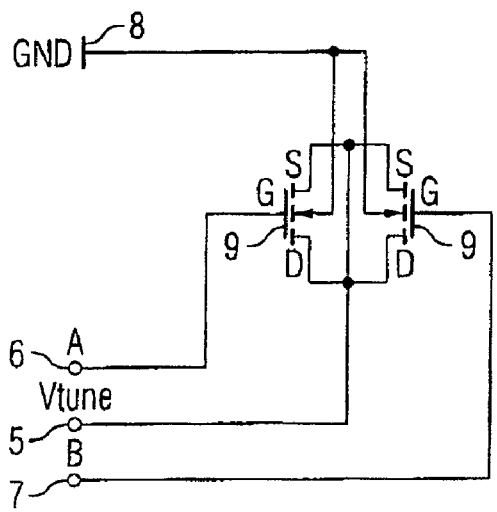
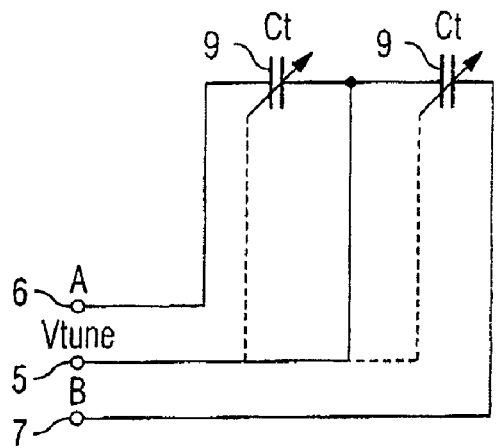

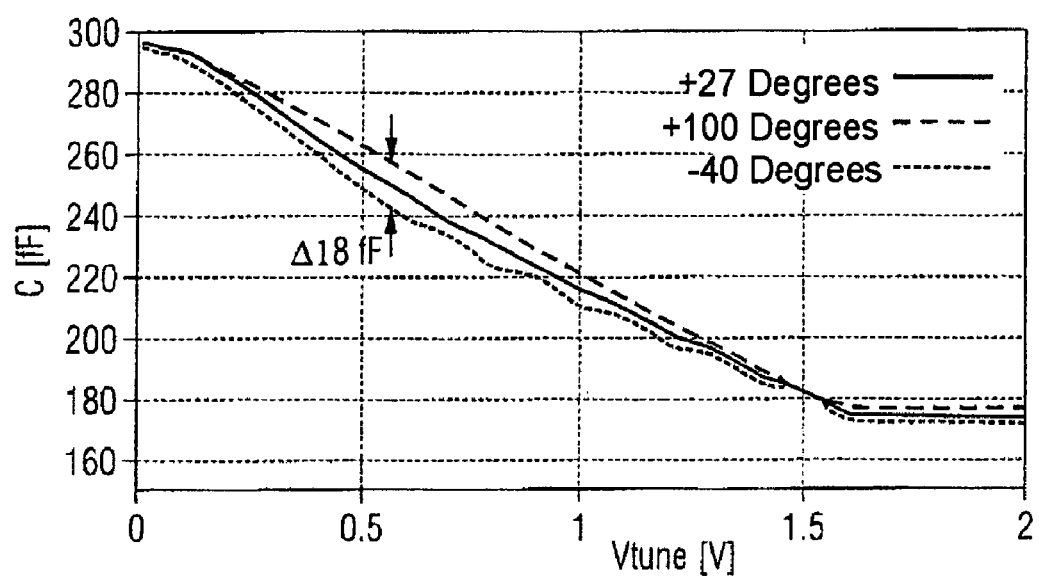

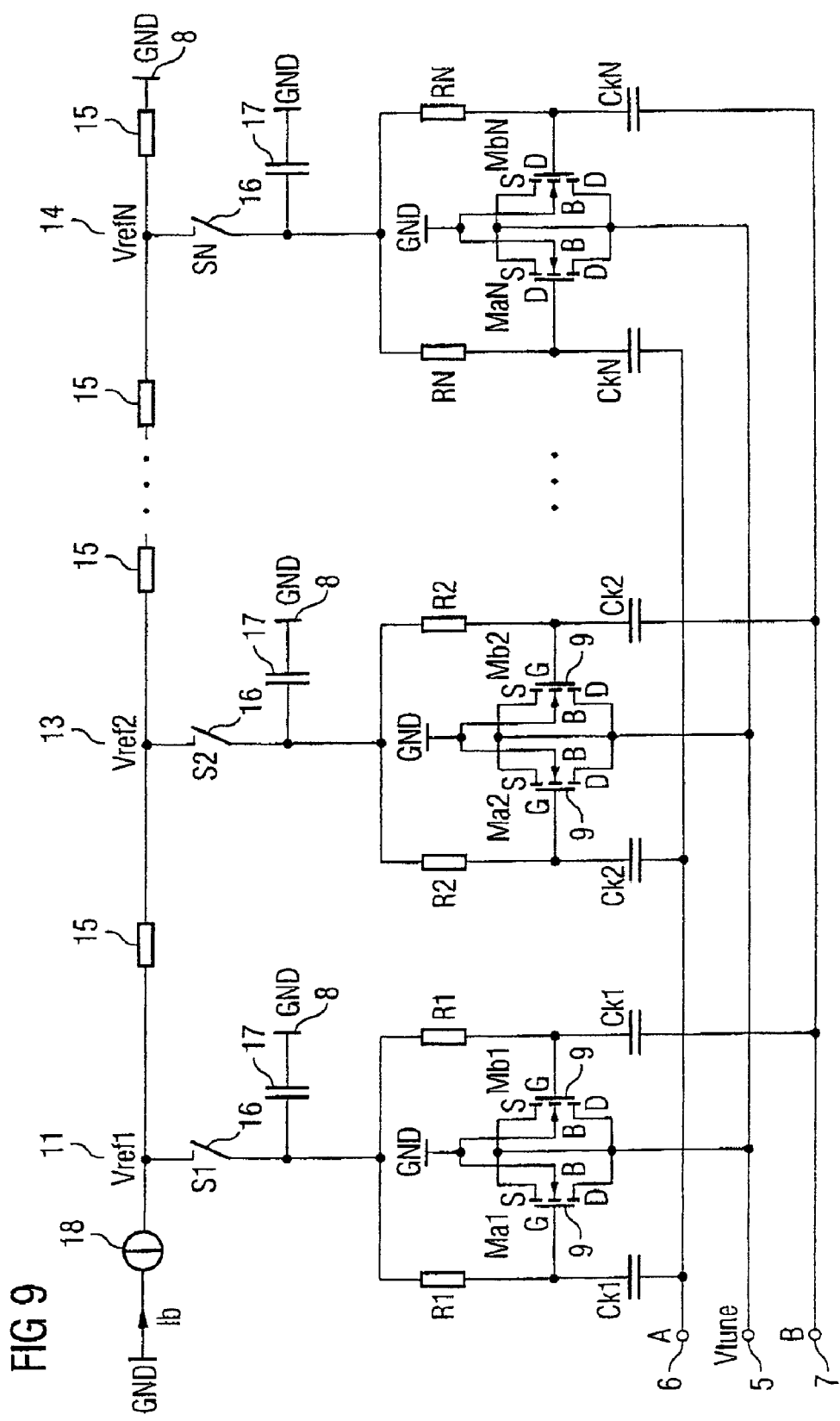

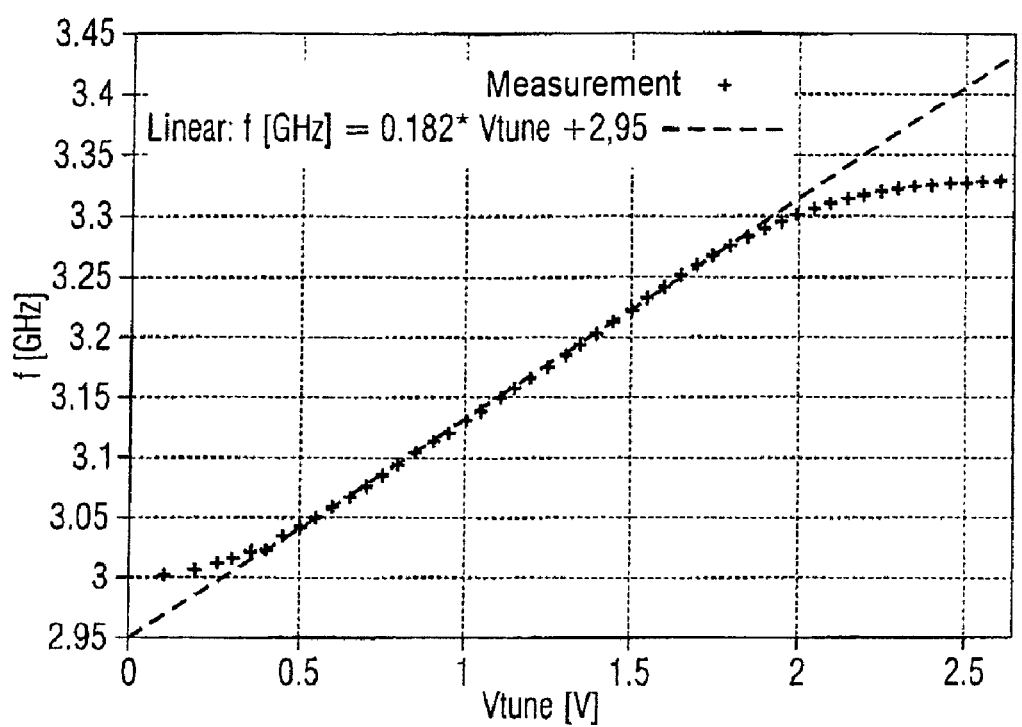

ial No. DE 102 09 517.5, filed on Mar. 4, 2002, the contents of which both are herein incorporated by reference in their entirety.

TUNABLE CAPACITIVE COMPONENT, AND LC OSCILLATOR WITH THE COMPONENT

REFERENCE TO RELATED APPLICATIONS

This application is a continuation of PCT/DE03/00390 filed Feb. 11, 2003, which was not published in English, that claims the benefit of the priority date of German Patent Application No. DE 102 09 517.5, filed on Mar. 4, 2002, the contents of which both are herein incorporated by reference in their entirety.

FIELD OF THE INVENTION

The present invention relates to a tunable, capacitive component and to an LC oscillator with the tunable, capacitive component.

BACKGROUND OF THE INVENTION

Tunable, capacitive components are normally provided by varactor diodes. In varactor diodes, the junction capacitance is dependent on an applied control voltage.

Varactor diodes or tunable, capacitive components are used in "voltage controlled oscillators" (VCOs), for example in large-scale productions. Voltage controlled oscillators in a resonant circuit normally comprise a fixed-value inductance in addition to a tunable capacitance and are therefore called LC oscillators. Varying the capacitance value of the tunable capacitance sets the oscillation frequency of the oscillator. Such voltage controlled oscillators are required in transmission and reception appliances, for example, in a mobile radio.

FIG. 1 shows a basic circuit arrangement for a voltage controlled LC oscillator having two inductances 1, two tunable capacitances 2 and two cross-coupled NMOS transistors 3 based on the prior art with symmetrical design. The oscillation frequency Fosc of the LC VCO shown in FIG. 1 is determined, in a good approximation, by the resonant frequency of the LC circuit, which is dependent on the product of effective inductance and effective capacitance. The frequency Fosc of the LC VCO can therefore be controlled by the voltage controlled capacitances 2, which can be set using the voltage Vtune. The LC oscillator comprising the actual LC resonant circuit 1, 2 and the damping reduction amplifier 3 coupled thereto is fed by a reference current source 4.

In FIG. 1, the controlling voltage Vtune is applied to the controlled capacitances 2 at their connecting node, which forms the circuit input 5. A pair of circuit nodes 6, 7 forms the output of the circuit, so that the controlling voltage Vtune applied externally to reference potential connection 8 respectively does not impress the controlling voltage at the (capacitance) control inputs of the varactors 2 directly. The voltages at the nodes 6, 7 oscillate with a 180-degree phase shift at the frequency Fosc and the amplitude Uosc around a mean voltage value which, when measured with respect to ground, is dependent on the current Iref and the layout of the transistors 3. The current Iref in the reference current source 4 shown in FIG. 1 is never totally independent of the supply voltage in practice, which means that disturbances in the supply voltage are projected into the reference current Iref. In addition, even a reference current source is never totally noise- and disturbance-free itself.

Disturbances in the reference current Iref bring about co-directional fluctuations in potential at the outputs A and B of the LC VCO and are thus projected into the mean voltage value. Since the mean capacitance value of the varactors 2 is determined directly by the tuning voltage applied across the varactors 2, disturbances in the reference current Iref also alter the frequency Fosc or the phase of the LC VCO at the same time. Random disturbances in the frequency or phase of an oscillator oscillation are normally observed in the form of phase noise in the course of measurements.

For low LC VCO phase noise, it is therefore important, inter alia, for the change in the capacitance 2 with the controlling voltage not to be unnecessarily high. It is therefore desirable if the voltage range over which the capacitance 2 can be controlled is as large as possible, and at the same time the voltage dependency of the capacitance 2 is linear over the entire control voltage range.

So that amplitude noise is not transformed into phase noise, it is also advantageous if the controlled capacitance value is not a function of the voltage amplitude which is present across the capacitance 2.

So that the setting range for the capacitance 2 is available completely under all operating conditions, it is also important for the voltage dependency of the capacitance 2 to be independent of temperature across the entire control voltage range.

FIG. 2a shows a voltage controlled capacitance 2 based on the prior art with two normally off NMOS transistors 9 whose four source/drain connections are connected to the tuning input 5. The output node pair 6, 7 is connected to a respective gate connection on the transistors 9.

The circuit arrangement shown in FIG. 2a may be used unchanged for the LC VCO shown in FIG. 1. Co-directional fluctuations in potential at the connections 6, 7 in comparison with connection 5 respectively bring about—within the control range of the capacitances per unit length between the gate and the transistor channel—a co-directional change in the capacitances per unit length in the NMOS transistors 9 between the gates and the interconnected drain and source connections.

For the arrangement shown in FIG. 2a, the change in the capacitance or in the capacitances per unit length with the control voltage, which has an effective drop across the transistors 9 operating as varactor, is comparatively very large and is linear only in a very small range, which is smaller than 50 mV. If the amplitude Uosc at the outputs 6, 7 of the LC VCO is very large, the situation improves somewhat.

FIG. 2b shows the electrical equivalent circuit diagram of the tunable capacitance from FIG. 2a.

The document P. Andreani et al. "A 2.2 GHz CMOS VCO with Inductive Degeneration Noise Suppression", IEEE 2001 Custom Integrated Circuit Conference, pp. 197□200, IEEE/CICC 2001, ISBN 0-7803-6591-7 specifies a controllable capacitance in a VCO which is constructed using MOS transistors.

The document C. Samori et al. "A −94 dBc/Hz@100 kHz fully integrated 5-GHz CMOS VCO with 18% tuning range for Bluetooth Applications", IEEE 2001 Custom Integrated Circuit Conference, pp. 201–204, IEEE. CICC 2001, ISBN 0-7803-6591-7 specifies an LC VCO in which the tunable components used are PMOS varactors.

The common drawback of the known tunable capacitive components suitable for use in VCOs is that they do not have a large linear tuning range and/or relatively high series resistances. High series resistances result in poor quality, while too small a tuning range for a varactor or for a tunable capacitance entails the drawback, generally when used in a VCO, of just a narrow frequency band in which the VCO can be tuned. Finally, a low level of linearity results in circuit properties being dependent on the present operating point of the capacitive component, which in turn has a disadvantageous effect on the implementation of control loops etc.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to a tunable, capacitive component which is suitable for use in voltage controlled oscillators.

The tunable capacitive component of the present invention comprises a tuning input for supplying a tuning voltage, and a pair of circuit nodes between which a capacitance that can be tuned using the tuning voltage is provided. The component further includes a pair of MOS transistors that are coupled to the tuning input and whose four source/drain connections are connected to one another. In addition, two coupling capacitances are provided that are connected by a respective connection to a respective gate connection on the MOS transistors and by a respective further connection to a respective one of the circuit nodes. Further, the component includes two coupling resistors that are connected by a respective connection to a respective one of the gate connections on the MOS transistors and by a respective further connection to a connecting node. Lastly, the component also comprises a reference signal input designed to supply a reference signal to set the operating point of the MOS transistors, wherein the reference signal input is connected to the resistors at their connecting node or to the four source/drain connections.

The MOS transistors, which are connected to one another as a transistor pair, form controllable capacitances. These controllable capacitances are not connected directly to the pair of circuit nodes, however, but rather the dynamic connection to the circuit nodes is produced using the two coupling capacitances. As a result, low-frequency and DC voltage fluctuations in the mean voltage value of the voltage between the switching nodes are advantageously no longer incorporated into the tuning voltage.

The coupling between the pair of MOS transistors and the tuning input may be in indirect or direct form.

The two coupling capacitances preferably have capacitance values that are large as compared with the maximum capacitance values that can be set for the MOS transistors.

The coupling resistors preferably have resistance values that are large as compared with the reciprocal of the product of $2\pi$, the oscillator frequency and the capacitance value of the MOS transistors.

The present invention is based on the insight that the fact that the capacitive component is in the form of a pair of MOS transistors in combination with the provision of a reference signal input that is designed to set the operating point of the MOS transistors using a reference signal produces a tunable, capacitive component that has an adjustable tuning range.

The tuning input is preferably connected to the source/drain connections of the transistor pair, or alternatively to the gate connections of the transistors, via coupling resistors. The reference signal input is respectively coupled to the opposite input.

If the MOS transistors have a bulk connection, said bulk connection is preferably connected to the reference potential connection, that is to say to a ground connection.

To improve the linearity properties of the tunable, capacitive component based on the present invention even further, it is possible to provide a further pair of MOS transistors or else any number of further pairs of MOS transistors. The further pair(s) of MOS transistors is/are connected in parallel with the first pair of MOS transistors mentioned such that the gate connections are likewise connected to the pair of circuit nodes which form the output of the capacitive component via further pairs of coupling capacitances. The tuning input and the reference signal input are designed according to the way in which the first pair of MOS transistors mentioned is connected up. If the tuning input is connected to the four source/drain connections of the pair of MOS transistors, then all further pairs of MOS transistors are also connected directly to one another and to the tuning input by their respective four source/drain connections. In this case, the further reference signal inputs, a respective one of which is associated with a respected transistor pair, are connected in pairs to the gate connections of the transistor pairs via further coupling resistors.

Alternatively, the reference signal input and the further reference signal input(s) is/are connected to the respective four source/drain connections of the associated transistor pair. In this case, the further MOS transistor pairs are respectively coupled in pairs to a further resistor pair by the common tuning input.

It should be noted that the reference signal inputs can be coupled to the transistor pairs connectably and disconnectably both in the case of the first alternative and in the case of the second alternative for actuating the MOS transistor pairs with a tuning and reference signal, for the purpose of connecting and disconnecting respective reference signals.

The respectively associated reference signals that can be supplied to the individual transistor pairs may be different.

Since the invention that is presented can be used to set the operating points of the MOS transistor pairs operating as tunable capacitances independently of one another, it is possible to attain a tuning characteristic for the entire, tunable, capacitive component that exhibits practically any good degree of linearity.

The reference signals provided for setting the operating point can be provided easily, for example using a resistor chain that is connected to a reference signal source and has tap points for tapping off respective reference signals, the tapping points being coupled to associated reference signal inputs directly or in switchable fashion.

Preferably, respective switches are provided that couple the reference signal inputs to the associated MOS transistor pairs for the purpose of connecting and disconnecting the respective reference signals. This means that it is possible to precharge stabilization capacitances that are connected to ground at the transistor end, for example, and that, in turn, ensure that, with the switches open, even in the case of disturbances on the supply voltage, for example, the linear relationship between the effective capacitance between the circuit nodes and the tuning voltage, that is to say the tuning characteristic's high degree of linearity that is achieved with the present invention, is maintained.

Advantageously, the capacitance values of the stabilization capacitances are high as compared with those of the transistor capacitances.

To compensate for any deviations from the ideal that arise for the switches that switch the reference signal, for example leakage currents, it is advantageous for the signal paths used for supplying the reference signal to have transistors or diodes additionally inserted into them that bring about a "nonlinear potential link". This makes it a simple matter to compensate for leakage current losses in the switches.

In accordance with another aspect of the invention an LC oscillator having a tunable, capacitive component as described above is provided, comprising a resonator core having an inductance and having the tunable capacitive component as components that determine a resonant circuit frequency. The oscillator further comprises a damping reduction amplifier that provides a negative impedance and is coupled to the resonator core. A tuning voltage is supplied to the tuning input and is used to tune the resonant circuit frequency of the oscillator.

The advantages of the inventive tunable, capacitive component, namely a high variation ratio, highly linear and preferably temperature-stable tuning characteristic and also low series resistance, arise with particular advantage when the component is used in an LC oscillator.

By way of example, a high variation ratio for the tunable capacitance, that is to say a high quotient comprising the largest and the smallest settable capacitance, allows the oscillator frequency of the LC resonant circuit to be tuned over a large frequency range. This feature is particularly advantageous upon use in local oscillators of radiofrequency transmission and reception appliances, since it is thus possible to address a multiplicity of transmission channels that are a long way apart. The highly linear tuning characteristic of the tunable, capacitive component permits circuit properties to be dimensioned independently of operating point, particularly when implementing control loops. Finally, the low series resistance of the capacitance results in a high quality in the oscillator circuit.

All in all, the LC oscillator with the tunable, capacitive component based on the present invention exhibits particularly low phase noise.

BRIEF DESCRIPTION OF THE DRAWINGS

The invention is explained in more detail with the aid of a plurality of exemplary embodiments which are shown in the drawings, in which:

FIG. 1 shows a basic circuit diagram of an LC VCO with NMOS transistors based on the prior art, FIG. 2a shows a controllable capacitance formed using NMOS transistors based on the prior art, FIG. 2b shows the electrical equivalent circuit diagram for FIG. 2a, FIG. 3a shows a first exemplary embodiment of a controllable capacitance with NMOS transistors based on the present invention.

FIG. 4b shows the electrical equivalent circuit diagram for FIG. 4a,

FIG. 8 shows a tuning characteristic for the controllable capacitance of FIG. 7, FIG. 9 shows a variation of the tunable capacitance of FIG. 7 with disconnectable precharging in accordance with yet another aspect of the invention, FIG. 15 shows a control characteristic for a VCO in line with FIG. 5 with the use of a tunable capacitance in line with FIG. 11.

DETAILED DESCRIPTION OF THE INVENTION

Figure 3A:
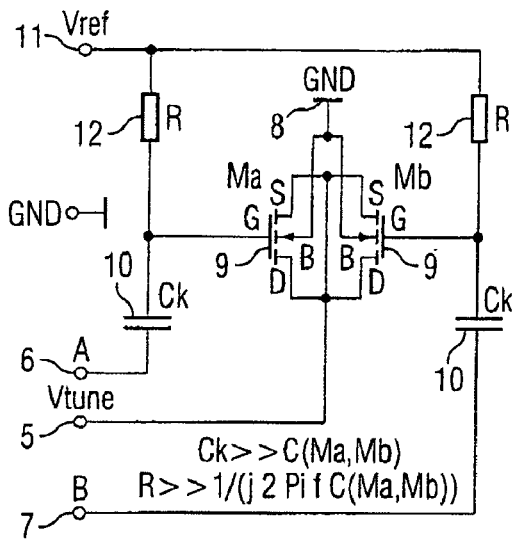
FIG. 3b shows an electrical equivalent circuit diagram for FIG. 3a, FIG. 4a shows a second exemplary embodiment of a controllable capacitance with NMOS transistors based on the present invention.

FIG. 3a shows an exemplary embodiment of a voltage controlled capacitance based on the present invention with two normally off NMOS transistors 9 whose gate connections are dynamically coupled to the nodes 6, 7 via coupling capacitances 10. The four source/drain load connections of the transistors 9 are connected to one another and to the tuning input 5. In addition, a reference signal input 11 for setting the operating point of the transistors 9 is provided which is connected to a respective gate connection on the latter via a respective coupling resistor 12.

One advantage of the coupling capacitances 10 is that DC and low-frequency voltage fluctuations in the mean voltage value are no longer incorporated into the control voltage for the transistors 9. Advantageously, the provided option of setting the operating point of the transistors 9 permits any good degree of linearization for the tuning characteristic, as explained in more detail later.

Preferably, this situation should satisfy the unbalanced equation that the coupling capacitances are large as compared with the tunable capacitances 9.

So that the resistive value R of the preferably homogeneous resistors 12 via which the DC potential Vref at the reference signal input 11 is transferred to the gates of the NMOS transistors 9 is not incorporated into the LC VCO oscillation frequency Fosc, the resistance R should be chosen to be as high as possible, so that the following applies:

$$R \gg \frac{1}{2\pi \cdot F_{OSC} \cdot Ct},$$

where Ct represents the controllable capacitance value of the transistors 9 operating as a varactor.

Figure 3B:
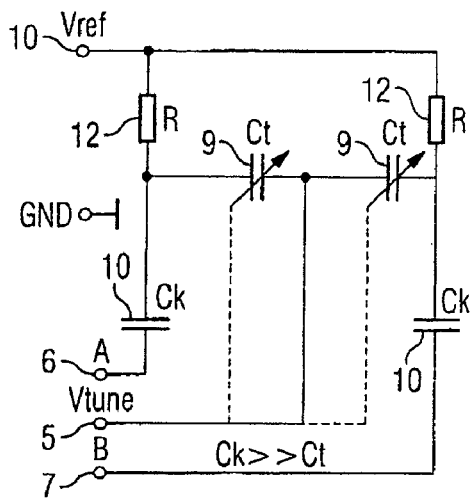

FIG. 3b shows the electrical equivalent circuit diagram for the subject matter of FIG. 3a.

Figure 4A:
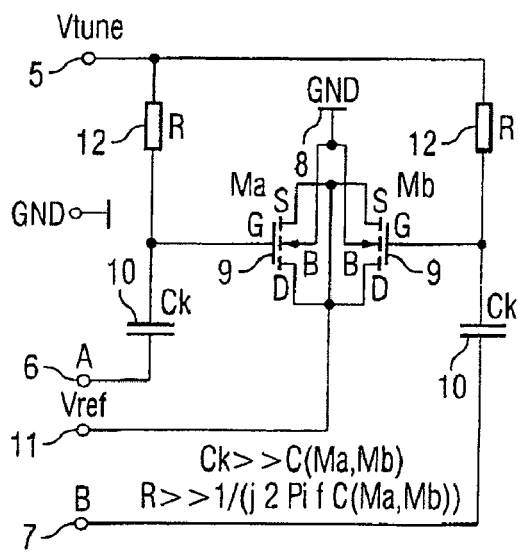

FIG. 4a shows an alternative embodiment of the subject matter of FIG. 3a. This subject matter largely corresponds to that in FIG. 3a in terms of components, design and advantageous operation, but the connections for the tuning voltage and the reference signal 5, 11 have been swapped. Accordingly, the tuning input 5 is in this case connected to the gates of the transistors 9 via resistors 12, while the reference signal input 11 is connected to the source/drain connections of said transistors.

Figure 4B:
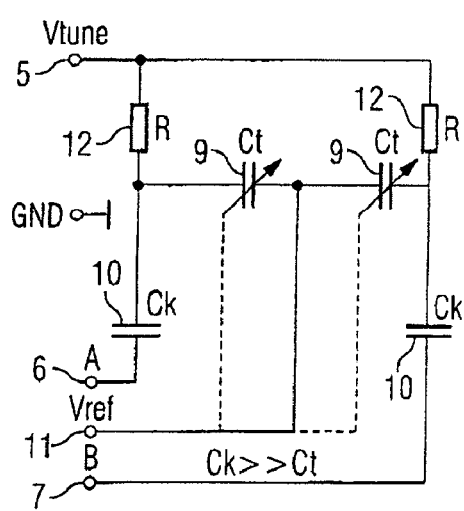

FIG. 4b shows the electrical equivalent circuit diagram for the subject matter of FIG. 4a.

Figure 5:
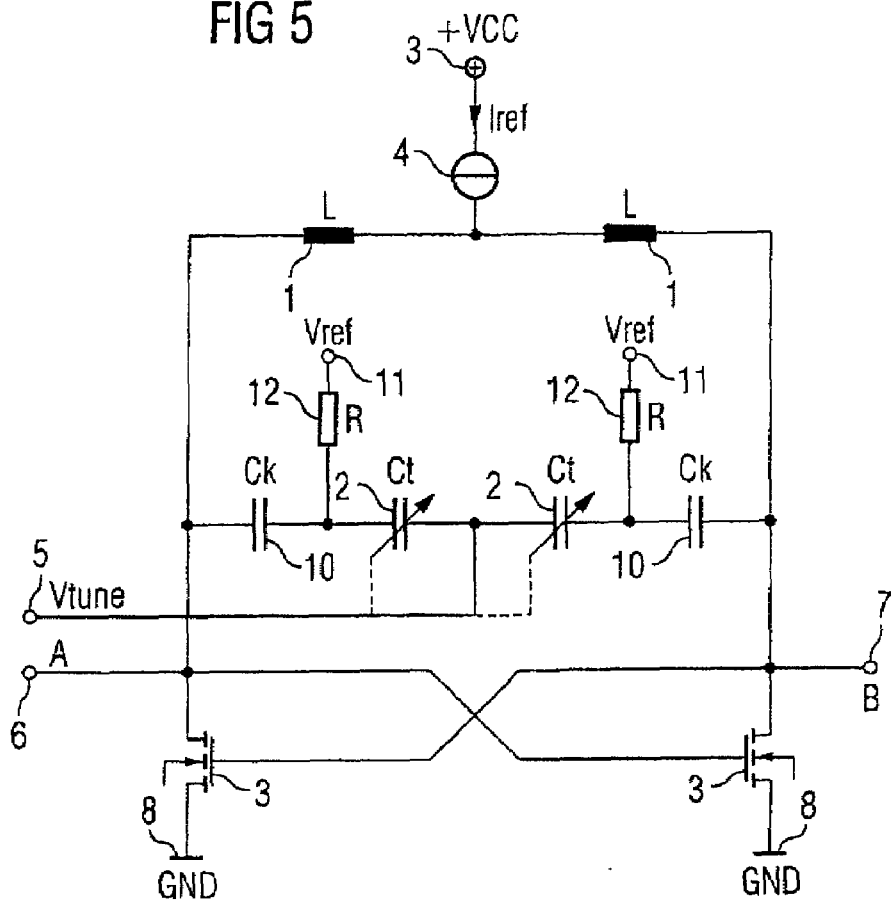
FIG. 5 shows an LC VCO with a tunable capacitance in accordance with the invention of FIG. 3a, FIG. 6 shows a tuning characteristic for a controllable capacitance with NMOS transistors.

FIG. 5 shows an improved circuit arrangement (as compared with FIG. 1) for a voltage controlled LC oscillator with NMOS transistors 9 based on the present invention, as shown in FIGS. 3a or 4a. In contrast to FIG. 1, the controllable capacitances 2 are no longer connected to the nodes 6, 7 directly, but rather via coupling capacitances 10, with the advantages and dimensioning rules that have already been explained.

This technical advantage naturally becomes prominent particularly when the reference potential Vref at the reference signal input 11 can also be regarded as being disturbance-free at the same time. This is the case, by way of example, when the potential Vref is identical to the GND potential at the reference potential connection 8.

Figure 6:
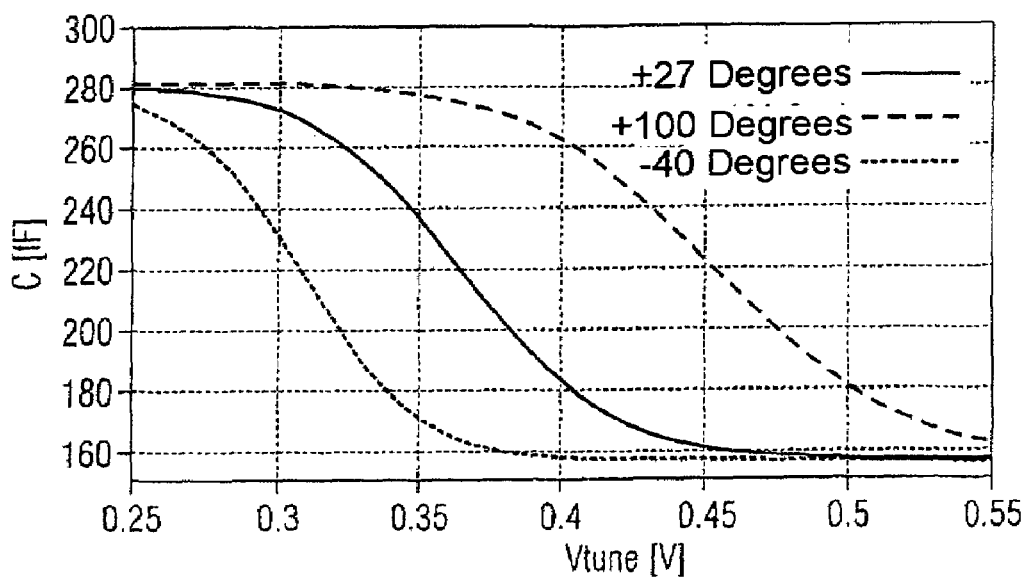

FIG. 6 shows, by way of example, the simulated low-level signal relationship between the control voltage Vtune and the effective capacitance C between the nodes 6, 7 for a voltage controlled capacitance 2 of the design shown in FIG. 3a with normally off NMOS transistors 9 which are dynamically coupled to the nodes 6, 7 via the coupling capacitances 10. In the simulation, the zero field threshold voltage of the NMOS transistors Vth0=0.5 volts and the reference voltage Vref which is present on the connection 11 is 1 volt. It is generally true for the gate/source and gate/drain voltages UGS, UGD that $$UGS = UGD = Vref - Vtune$$

From the comparison between the simulation result shown in FIG. 6 and the equation, it follows that the control range of a MOS capacitance is centered about its MOS threshold voltage Vth0 and is no more than approximately 250 mV. Since the control range of a MOS capacitance is always centered about the MOS threshold voltage Vth0 out of principle, the control range of a MOS capacitance also moves on the basis of the temperature response of the MOS threshold voltage Vth0.

For Vref=0 volt, the control voltage range of Vtune moves completely into the negative range. Since, in monolithic integration, normally positive values are implemented for Vtune, however, the value for Vref for the circuit arrangement shown in FIG. 3a normally is to be greater than or equal to Vth0. As already mentioned above, the GND potential itself would be an ideally disturbance-free reference potential for Vref, however.

The swapping of the connections Vtune and Vref in FIG. 4a as compared with FIG. 3a means that for Vref=0 volt the control voltage range for Vtune is in the positive range. In addition, in FIG. 4a the control relationship between the control voltage Vtune and the effective capacitance between the nodes 6, 7 is inverted as compared with the low-level signal relationship shown in FIG. 6.

Leaving aside the control action of the potential difference between the bulk and source connections on the degree of inversion in the MOS transistor channel (substrate control effect), the connections 5, 11 for Vtune and Vref can also be regarded as a differential voltage control input for the capacitance which is effective between the nodes 6, 7, so that the subject matter shown in FIG. 3a and FIG. 4a are actually identical in the technical sense in this mode of consideration.

Figure 7:
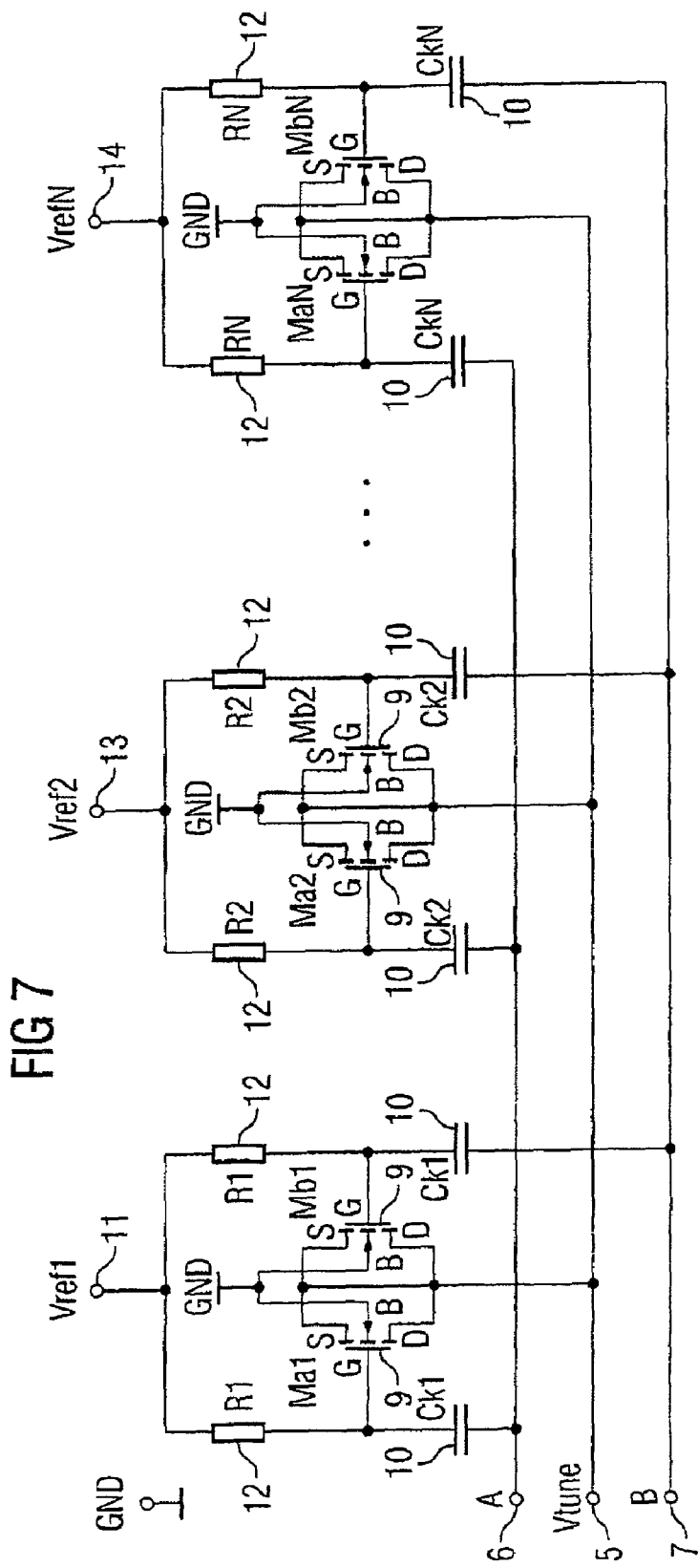
FIG. 7 shows a variation of the tunable capacitance from FIG. 3a in accordance with another aspect of the invention.

FIG. 7 shows a circuit arrangement which, for the tuning input 5 and output pair node pair 6, 7 connections, comprises N parallel connected, technically advantageously homogeneous circuit arrangements in line with FIG. 3a. The reference signal connections for supplying the reference signals Vref1 to VrefN are not connected to one another, however, in this example.

The reference signal connections 11, 13, 14 are at potentials which systematically increase or systematically decrease with respect to the GND potential, technically advantageously in the same order of magnitude. So that the adjustment range for the capacitance between the nodes 6, 7 in the circuit arrangement from FIG. 7 corresponds approximately to the adjustment range for a circuit arrangement as shown in FIG. 3a, the following conversion condition may be used, by way of example:

The coupling capacitances are reduced in size by a factor of N as compared with the subject matter in FIG. 3a. By contrast, the coupling resistors are increased in size by a factor of N. Channel lengths in the transistors 9 are maintained. Channel widths in the transistors 9 are reduced in size by a factor of N. For reasons of symmetry, it is technically advantageous that the geometric layout of the transistors 9 is identical or substantially similar.

In principle, the circuit arrangement shown in FIG. 7 may, in the manner described, also alternatively be produced using technically advantageously homogeneous circuit arrangements as shown in FIG. 4a.

The fact that the connections Vref1 to VrefN are at different potentials means that, with a suitable choice of potentials and with a sufficiently large division factor N, the respective individual control characteristics for the N parallel connected circuit arrangements shown in FIG. 3a and FIG. 4a are overlaid on one another to produce an altogether linear relationship between Vtune and the effective capacitance between the nodes 6, 7.

FIG. 8 shows, by way of example, the simulated relationship between the control voltage Vtune and the effective capacitance between the nodes 6, 7 for a voltage controlled capacitance as shown in FIG. 7 with normally off NMOS transistors. The division factor N is 10. The simulation result shown in FIG. 8 shows that there is now an approximately linear relationship between the effective capacitance and the control voltage Vtune over a comparatively large range of approximately 1.5 volt. The comparison with the simulation result shown in FIG. 6 also shows that the influence of the temperature on the voltage dependency of the capacitance over the entire control voltage range has subsided significantly.

The technically advantageous response of the circuit arrangement shown in FIG. 7, which is shown in FIG. 8 by way of example, can be used to advantage in practice particularly when the reference potentials Vref1 to VrefN can be derived from the supply voltage +VCC such that any disturbances in the supply voltage +VCC which there may be are not projected into the reference potentials Vref1 to VrefN.

FIG. 9 shows a development of the circuit arrangement shown in FIG. 7. The potentials Vref1 to VrefN are produced by supplying current using a resistor chain. For this purpose, a series circuit comprising resistors 15 is provided which has tap points between the resistors 15, which are coupled to a respective associated reference signal input on a tunable capacitance element as shown in FIG. 3a. For this coupling, a respective switch 16 is provided. On the varactor side, each switch is connected up to the reference potential 8 using a capacitance 17. The resistor chain, which forms a voltage divider, is connected to a reference signal source 18 connected thereto which is in the form of a current source. The resistor chain is also connected to the reference potential connection 8.

The electronic switches 16 are used to charge both the gates of the NMOS transistors 9 associated in pairs and the storage capacitors 17 to the respective potentials generated in this manner. After the end of the charging phase, the switches 16 are opened. The charges applied to the gates of the NMOS transistors 9 and to the storage capacitors 17 now ensure that the linear relationship between the effective capacitance between the nodes 6, 7 and the control voltage Vtune is maintained.

For this situation, it is preferably true that the capacitance value of the storage capacitors 17 is a respective multiple (>10) of the maximum MOS capacitance of the NMOS transistors 9, since, from the point of view of the control input 5, the respective storage capacitors 17 form a capacitive voltage divider with the NMOS transistors 9. When the switches 16 have opened, the volume of charge applied on the gates of the NMOS transistors 9 and the storage capacitors 17 practically cannot change again, e.g. as a result of disturbances to +VCC.

The above statement applies particularly when the switches 16 are ideal switches. The electronic switches used in monolithic integration preferably comprise real transistors with properties of finite quality. Electronic MOS switches have leakage currents arising, for example; the 'off' resistance is not infinitely high and the 'on' resistance is not zero.

In principle, the circuit arrangement shown in FIG. 9 is alternatively also conceivable, in the manner described, with technically advantageously homogeneous circuit arrangements in line with FIG. 4a.

If the circuit connected to the nodes 6, 7 has a low resistance path to ground, then the coupling capacitors 17 additionally also act as storage capacitors.

Figure 10A:
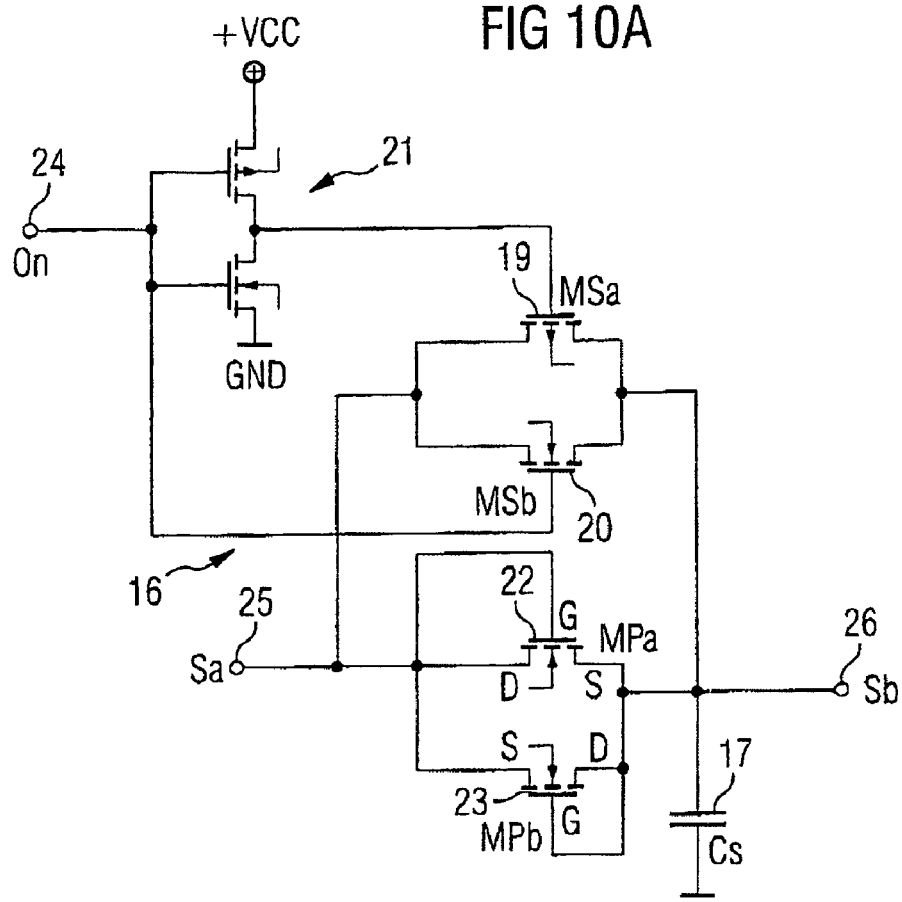
FIG. 10a shows an exemplary embodiment of a switch of FIG. 9.

FIG. 10a shows an electronic switch 16 as may be used in the subject matter in FIG. 9, for example. The switch 16 comprises the complementary switching transistors 19, 20, whose controlled paths are connected in parallel and form the load path of the switch 16. To actuate the gates of the transistor 19, an inverter 21 has its output connected to this control input. The controlled paths of the transistors 19, 20 also have the controlled paths of a further complementary transistor pair 22, 23 connected in parallel with them. These transistors 22, 23 are connected as diodes.

From the state level at the control input 24 of the inverter 21 and hence of the switch 16, an inverted control signal for the transistor 19 is produced using the inverter 21. With an H level at the control input 24, both the transistor 19 and the transistor 20 are on. With an L level at the control input 24, the transistors 19 and 20 are off. The connection 25 forms the input of the switch and the connection 26 forms the output. The storage capacitor 17 connected to the output 26 forms a time constant with the forward resistance between the nodes 25, 26.

As already mentioned, an electronic switch may have leakage currents arising which, with appropriate use of such a switch for a piece of subject matter as shown in FIG. 9, may possibly result in a slow change in the charges on the gates of the NMOS transistors 9. For this reason, the circuit arrangement shown in FIG. 10a for an electronic switch 16 has been extended by the NMOS transistors 22, 23, which bring about a "nonlinear potential link". While the switch connections 25, 26 have the same potential, the transistors 22, 23 are off, i.e. are at maximum high resistance. When the switch connections 25, 26 have different potentials, then, depending on the arithmetic sign of the potential difference, either the diode 22 or the diode 23 becomes slightly conductive in line with the level of the potential difference. When the transistors 19, 20 are in the off state, the diodes 22, 23 prevent leakage currents from allowing the charges on the gates of the NMOS transistors 9 and the capacitances 17 in FIG. 9 to change all too greatly. The leakage current losses are compensated for by means of the leakage-current-dependent conductivity in the switches. Since leakage currents in electronic switches having minimal dimensions are normally very small, that is to say smaller than 1 pA, both the voltage drop between the drain and the source via diodes 22, 23 and the differential conductivity thereof always remain very low. Consequently, when the transistors 19, 20 are in the off state, viewed from the connection 25 in the direction 26, the time constant of the low pass filter between the connections 25, 26, which in the case of a leakage current is essentially formed by the differential conductivity of the diodes 22, 23 and the capacitance 17, is very large.

Figure 10B:
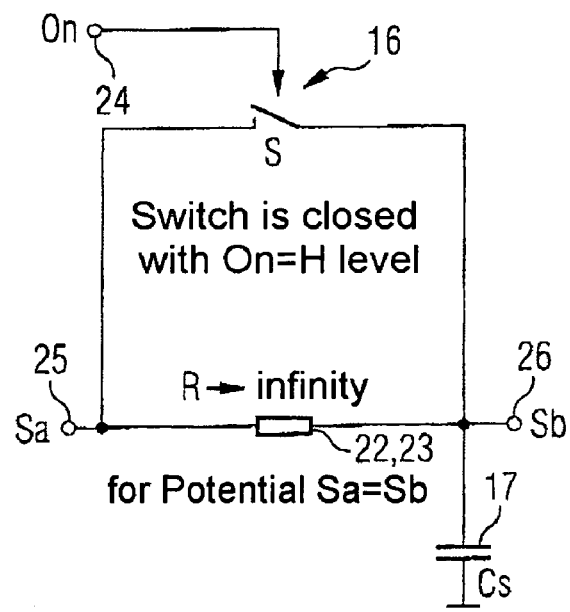
FIG. 10b shows an equivalent circuit diagram for the switch from FIG. 10a, FIG. 11 shows a variation of the tunable capacitance from FIG. 9 with additional temperature compensation for the operating points in accordance with still another aspect of the present invention.

FIG. 10b shows the electrical equivalent circuit diagram for the switch 16 shown in FIG. 10a.

Figure 11:
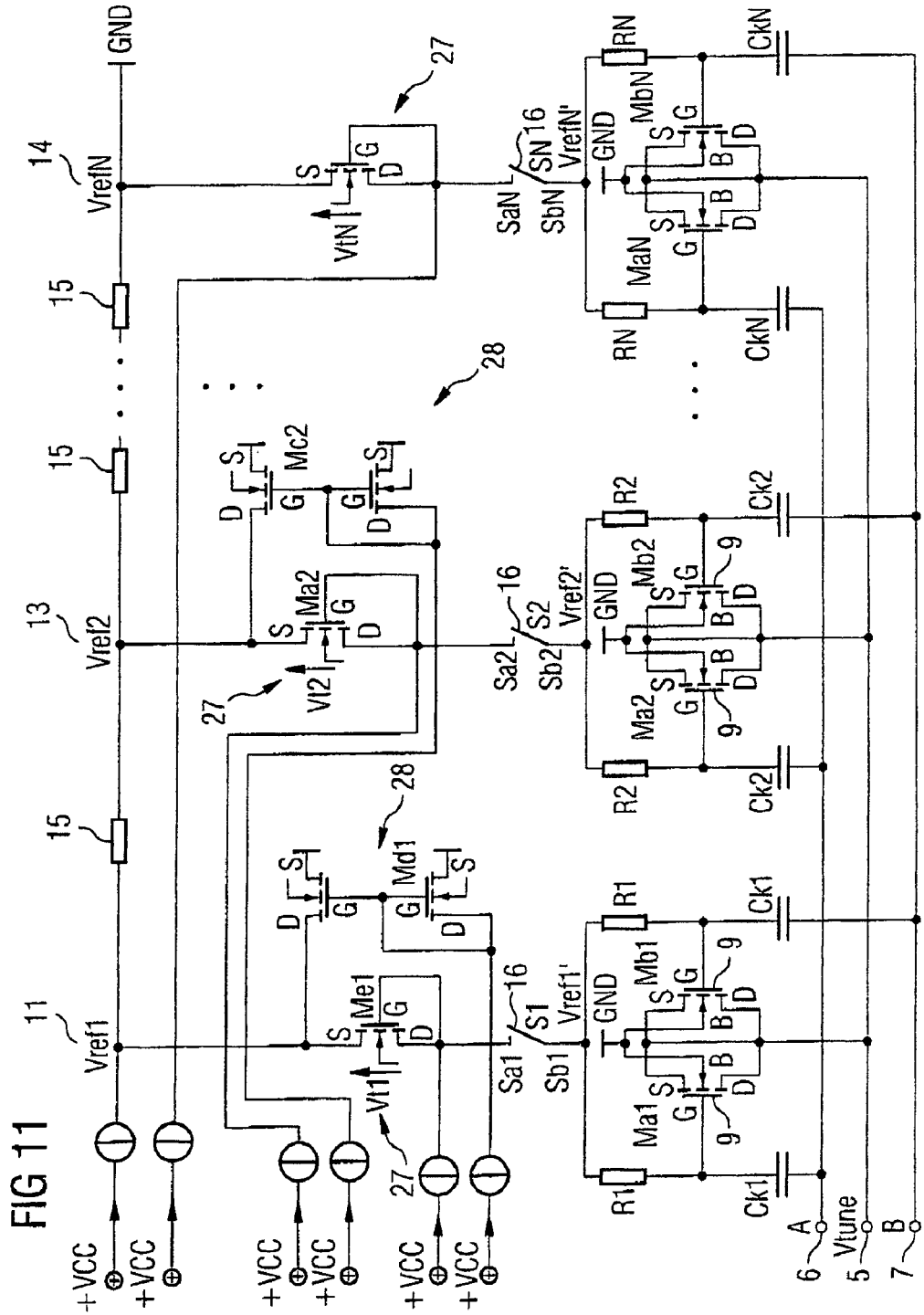

FIG. 11 shows an extension of the circuit arrangement shown in FIG. 9. This largely corresponds to the subject matter of FIG. 9 in terms of design and advantageous mode of action. By contrast, however, the controlled paths of respective auxiliary transistors 27 are connected between the tap points of the resistor chain 15 and the switches 16.

The source connections of the transistors 27 are respectively connected to the tap points which provide the reference signals Vref1 to VrefN. The drain connections are connected to the inputs 25 of the respective electronic switches 16. A respective reference current Ic fed in at the drain connections of the transistors 27 is dissipated again, in each case with the aid of current mirror arrangements 28 that are connected to the source connections of the transistors 27, such that no current is ever fed into the reference voltage tap points Vref1 to Vref(N−1). The source connection of the Nth auxiliary transistor 27 is connected to VrefN=GND, and therefore the Nth current mirror arrangement 28 is dispensed with in this case. The inputs 25 of the respective electronic switches 16 shown in FIG. 10 have the reference voltages Vref1' to VrefN' applied to them, which are respectively shifted by the voltage components Vt1, . . . VtN as compared with the voltages Vref1 to VrefN in the manner described below.

The voltages Vref1 to VrefN generated with respect to ground are now no longer transferred to the gates of the NMOS transistors 9 directly via the electronic switches 16. In this case, they are now first of all shifted by the voltage components Vt1, . . . VtN onto Vref1' to VrefN', on the following basis:

$$Vref1' = Vref1 + Vt1$$

$$Vref2' = Vref2 + Vt2$$

$$VrefN' = VrefN + VtN$$

The voltage components Vt1, . . . VtN are generated using the auxiliary transistors 27, which each have a reference current Ic flowing through them. The level of the reference current Ic is chosen such that the voltage drop from drain to source over the auxiliary transistors 27 corresponds to the threshold voltages Vt1, . . . VtN in a good approximation.

Ideally, the voltage components Vt1, . . . VtN generated correspond to the respective threshold voltages of the divided MOS capacitors 9. If the generation and overlaying of the voltage components Vt1, . . . VtN on Vref1 to VrefN are managed exactly, then the influence of the threshold voltages of the divided MOS capacitors 9 on the characteristic response between the effective capacitance between the nodes 6, 7 and the control voltage Vtune is eliminated. The reason for this is that the control range of an MOS capacitor is always centered about the MOS threshold voltage Vt.

The shift described here in the voltages Vref1 to VrefN, generated with respect to ground, by the respective threshold voltages Vt1, . . . VtN of the divided MOS capacitors 9 centers the respective control ranges of the MOS capacitors 9 exactly on the voltages Vref1 to VrefN generated with respect to GND. The influence of the MOS threshold voltages which are dependent on the temperature and those which are dependent on the substrate bias voltages is eliminated.

Figure 12:
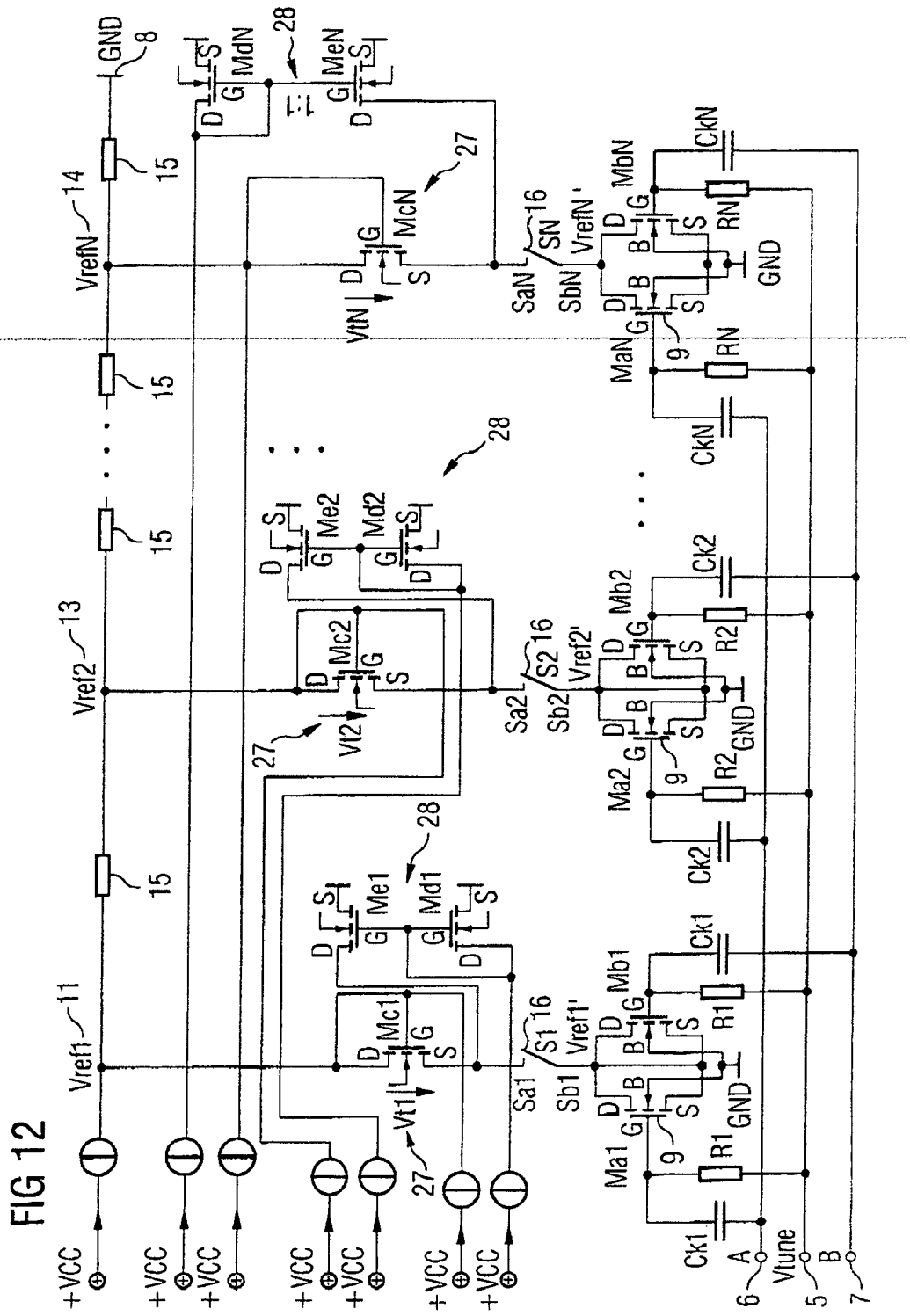
FIG. 12 shows the subject matter of FIG. 11, but with the basic circuit in line with FIG. 4a instead of FIG. 3a, FIG. 13 shows a tuning characteristic for the controllable capacitance from FIG. 11.

FIG. 12 shows a variant of the circuit arrangement shown in FIG. 11 with appropriate use of the circuit arrangement shown in FIG. 4a instead of that shown in FIG. 3a. The statements for FIG. 11 apply in appropriate fashion in this case. However, in this case the following is true for the shift in the voltages Vrefi by the voltage components Vti onto Vrefi', where I=1 . . . N:

$$Vrefi' = Vrefi - Vti$$

In comparison with the arrangement in FIG. 11, the control relationship between the control voltage Vtune and the effective capacitance between the nodes 6, 7 is accordingly inverted as compared with the relationship shown below in FIG. 13.

Figure 13:
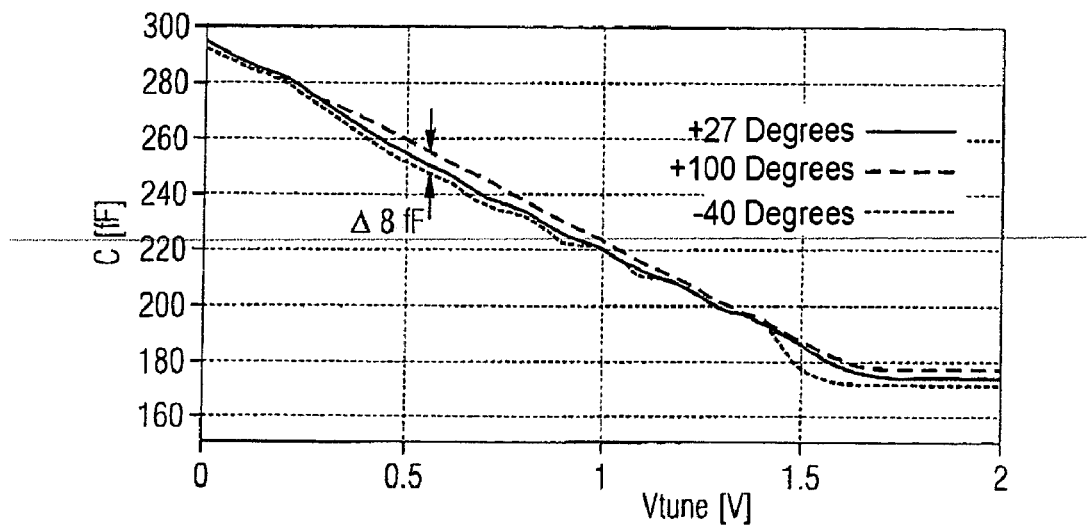

FIG. 13 shows, by way of example, the simulated relationship between the control voltage Vtune and the effective capacitance between the nodes 6, 7 for a voltage controlled capacitance in line with FIG. 11 with normally off NMOS transistors. The division factor N is 10.

The simulation result illustrated in FIG. 13 shows that there is a highly linear relationship between the effective capacitance and the control voltage over a comparatively large range of approximately 1.6 volts. In addition, the comparison with the simulation result shown in FIG. 8 shows that the influence of the temperature on the voltage dependency of the capacitance over the entire control voltage range has subsided even further. However, a precise consideration of the simulation result in FIG. 13 and FIG. 8 reveals that the linear relationship between the effective capacitance and the control voltage has a certain ripple overlaid on it which increases particularly at low temperatures. This "ripple" is firstly determined by the division factor N and secondly by the temperature, since the size of the respective MOS capacitors' reversal range is a function of the temperature. The size of the reversal range increases with the temperature.

Figure 14:
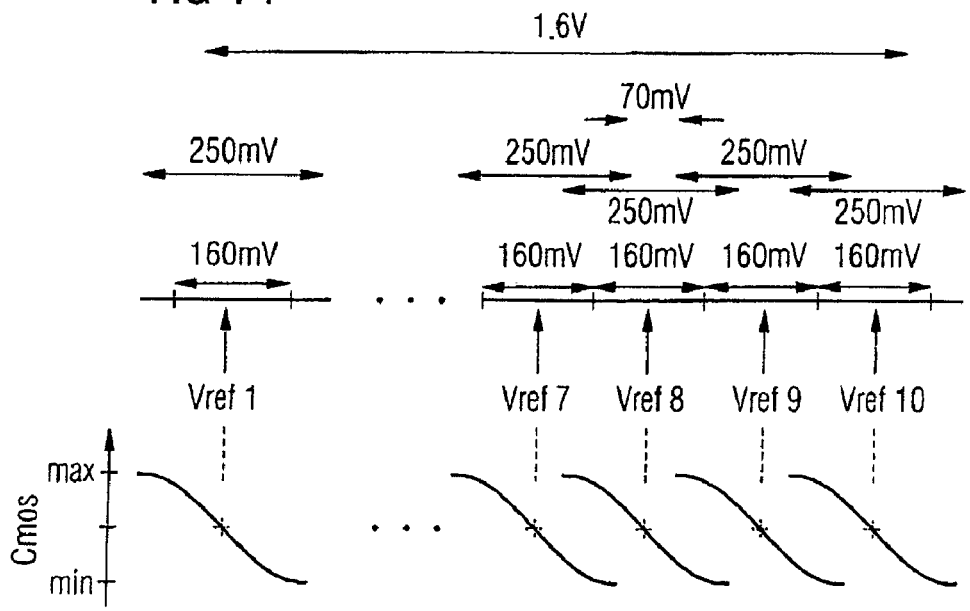
FIG. 14 shows a diagram to illustrate the superposition of the tuning characteristics with parallel connection of a plurality of capacitances with different operating points in line with the present invention.

FIG. 14 shows how the individual controlled capacitance characteristics for the MOS transistor pairs 9 are superimposed for the given case example N=10, in each case centered about the reference voltage values Vref1 to VrefN. In a case example, the following parameters exist: a linear control range for the tunable capacitance overall: approximately 1.6 volts, division into control range elements of approximately 160 mV each, respective maximum capacitive control range for the MOS transistor pairs: approximately 250 mV at 27 degrees, respective overlap between the capacitive control ranges of the MOS transistor pairs: approximately 180 mV at 27 degrees, capacitive control ranges without an overlap in each case: approximately 90 mV at 27 degrees, and respective linear capacitive control range for the MOS transistor pairs: approximately 50 mV at 27 degrees.

Since the respective capacitive control range of the MOS transistor pairs without a respective overlap at 27 degrees is approximately 40 mV larger than the respective linear capacitive control range of the MOS transistor pairs, the ripple which can be seen in FIG. 13 is inevitably obtained at 27 degrees. While maintaining a linear range of approximately 1.6 volts all in all, the ripple for N>>10 disappears completely. Excessively large values for N entail a wiring complexity which is accompanied by increasing parasitic effects, however.

When the highly linear capacitance based on the principle presented is used in an LC VCO as shown in FIG. 5, however, the effect of the ripple on the VCO control characteristic disappears completely, even when N is less than or equal to 10. This is because the large VCO amplitudes Uosc which are usually necessary for low phase noise mean that the low-level signal ripple averages itself out completely on a high-level signal basis over the oscillation amplitude Uosc in the course of one oscillation period.

In addition, the capacitive low-level signal value of the effective capacitance between the connections 6, 7, which value is defined by means of Vtune, corresponds largely to the effective high-level signal value insofar as the high-level signal value excursion between the connections 6, 7 does not exceed the order of magnitude of the linear range of Vtune. The reason for this is that with increasing dynamic amplitude at time t, the proportion of MOS capacitances 9 assuming their minimum value is the same as that of MOS capacitances 9 assuming their maximum value, which means that the effective net capacitance between the connections 6, 7 always remains largely constant.

FIG. 15 shows a control characteristic, measured at 27 degrees, for an LC VCO as shown in FIG. 5, which has a controllable capacitance in line with the arrangement shown in FIG. 11. The division factor N is 10.

It is clear to see from FIG. 15 that the VCO control characteristic has no ripple in the linear range. The linear range of the VCO control characteristic is approximately 1.5 volts in line with the linear range of the controllable capacitance.

Generally, the circuit diagrams described above may also be designed using complementary circuitry. Thus, by way of example, MOS capacitances may be produced using either N channel MOS transistors or P channel MOS transistors. The level of the zero field threshold voltage Vth0 of the MOS transistors 9 does not play a central part either. In addition, the function of a current mirror circuit, for example, may be implemented using simple or complex circuitry, for example using cascodes. Alternative embodiments of circuit structures indicated here can thus be regarded as equivalent means for achieving the principle presented which are within the scope of the invention.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

The invention claimed is:

1. A tunable, capacitive component, comprising:
   a tuning input for supplying a tuning voltage;
   a pair of circuit nodes between which a variable capacitance resides, having a capacitance value that is a function of the tuning voltage;
   a pair of MOS transistors coupled to the tuning input and whose four source/drain connections are connected to one another;
   a first pair of two coupling capacitances connected to a respective gate connection of the first pair of MOS transistors and to a respective one of the circuit nodes;
   a first pair of two coupling resistors connected to a respective one of the gate connections of the first pair of MOS transistors and to a connecting node;
   a first reference signal input configured to supply a first reference signal for setting an operating point of the first pair of MOS transistors, the first reference signal input connected to the first pair of resistors at the connecting node or to the four source/drain connections;
   a second pair of MOS transistors coupled to the tuning input and whose four source/drain connections are connected to one another;
   a second pair of two coupling capacitances connected to a respective gate connection of the second pair of MOS transistors and to a respective one of the circuit nodes;
   a second pair of two coupling resistors connected to a respective one of the gate connections on the second pair of MOS transistors and to a further connecting node; and
   a second reference signal input configured to supply a second reference signal for setting an operating point of the second pair of MOS transistors, the second reference signal input connected to the second pair of coupling resistors at their connecting node or to the four source/drain connections of the second pair of MOS transistors.

2. The component as claimed in claim 1, wherein the tuning input is connected to the four source/drain connections of the first and second pairs of MOS transistors, and the first and second reference signal inputs are connected to the respective connecting node of the first and second pair of two resistors.

3. The component as claimed in claim 1, wherein the tuning input is connected to the connecting node of the first and second pair or two resistors, and the first and second reference signal inputs are connected to the respective four source/drain connections of the first and second pairs of MOS transistors.

4. The component as claimed in claim 1, further comprising a resistor chain connected to a reference signal source, configured to provide the first and second reference signals, the resistor chain having tap points that are coupled to the respective first and second reference signal inputs.

5. The component as claimed in claim 1, further comprising:
   a first switch configured to selectively couple the first reference signal input to the first pair of MOS transistors for the purpose of connecting and disconnecting the first reference signal; and
   a second switch configured to selectively couple the second reference signal input to the second pair of MOS transistors for the purpose of connecting and disconnecting the second reference signal.

6. The component as claimed in claim 5, further comprising a respective capacitance connected to a reference potential connection of each of the first and second pairs of MOS transistors at a node associated with the first switch and the second switch, respectively.

7. The component as claimed in claim 5, further comprising:
   a first temperature compensation circuit configured to compensate for temperature-related operating point shifts, coupled to the first reference signal input; and
   a second temperature compensation circuit configured to compensate for temperature-related operating point shifts, coupled to the second reference signal input.

8. An LC oscillator, comprising:
   a resonator core comprising an inductance and a tunable capacitive component as components that determine a resonant circuit frequency; and
   a damping reduction amplifier coupled to the resonator core that provides a negative impedance to the LC oscillator, wherein the tunable, capacitive component comprises:
   a tuning input for supplying a tuning voltage;
   a pair of circuit nodes between which a variable capacitance resides, having a capacitance value that is a function of the tuning voltage;
   a pair of MOS transistors coupled to the tuning input and whose four source/drain connections are connected to one another;
   a first pair of two coupling capacitances connected to a respective gate connection of the first pair of MOS transistors and to a respective one of the circuit nodes;
   a first pair of two coupling resistors connected to a respective one of the gate connections of the first pair of MOS transistors and to a connecting node;
   a first reference signal input configured to supply a first reference signal for setting an operating point of the first pair of MOS transistors, the first reference signal input connected to the first pair of resistors at the connecting node or to the four source/drain connections;
   a second pair of MOS transistors coupled to the tuning input and whose four source/drain connections are connected to one another;
   a second pair of two coupling capacitances connected to a respective gate connection of the second pair of MOS transistors and to a respective one of the circuit nodes;
   a second pair of two coupling resistors connected to a respective one of the gate connections on the second pair of MOS transistors and to a further connecting node; and
   a second reference signal input configured to supply a second reference signal for setting an operating point of the second pair of MOS transistors, the second reference signal input connected to the second pair of coupling resistors at their connecting node or to the four source/drain connections of the second pair of MOS transistors.

* * * * *